United States Patent [19]

Collins

[11] Patent Number: 4,734,880
[45] Date of Patent: Mar. 29, 1988

[54] DYNAMIC RANDOM ACCESS MEMORY ARRANGEMENTS HAVING WE, RAS, AND CAS DERIVED FROM A SINGLE SYSTEM CLOCK

[75] Inventor: Mark C. Collins, Basingstoke, United Kingdom

[73] Assignee: Sony Corporation, Tokyo, Japan

[21] Appl. No.: 591,564

[22] Filed: Mar. 20, 1984

[30] Foreign Application Priority Data

Apr. 12, 1983 [GB] United Kingdom ............... 8309814

[51] Int. Cl.$^4$ .............................................. G06F 13/00
[52] U.S. Cl. ..................................... 364/900; 365/233
[58] Field of Search ................ 365/194, 189, 233; 364/900 MS File, 200 MS File, 200, 900

[56] References Cited

U.S. PATENT DOCUMENTS

| 3,969,706 | 7/1976 | Proebsting et al. | 365/189 |
| 4,241,418 | 12/1980 | Stanley | 364/900 |
| 4,337,523 | 6/1982 | Hotta | 365/233 |
| 4,503,429 | 3/1985 | Schreiber | 340/747 |
| 4,513,371 | 4/1985 | Celio | 364/200 |
| 4,542,454 | 9/1985 | Brcich | 364/222 |
| 4,564,926 | 1/1986 | Nikaido et al. | 365/233 |
| 4,571,705 | 2/1986 | Wada | 365/233 |

Primary Examiner—Raulfe B. Zache
Assistant Examiner—Emily Y. Chan
Attorney, Agent, or Firm—Lewis H. Eslinger; Alvin Sinderbrand

[57] ABSTRACT

A dynamic random access memory arrangement for storing digital television signal data under control of a system clock signal CK and input address signals A0 to A17 associated with the data, has a dynamic random access memory having a data input and a data output for the data, and an address input for the input address signals, the dynamic random access memory being controlled by a write enable signal $\overline{WE}$, a row address strobe signal $\overline{RAS}$ and a column address strobe signal $\overline{CAS}$, and a logic circuit is provided to derive the signals $\overline{WE}$, $\overline{RAS}$ and $\overline{CAS}$ from the system clock signal CK with respective timings each determined by a leading edge of a pulse of the system clock signal CK and delay devices.

4 Claims, 16 Drawing Figures

DYNAMIC RANDOM ACCESS MEMORY ARRANGEMENTS HAVING WE, RAS, AND CAS DERIVED FROM A SINGLE SYSTEM CLOCK

BACKGROUND OF THE INVENTION

1. Field of the Invention

This invention relates to dynamic random access memory arrangments, and is particularly concerned with the generation of control signals for a dynamic random access memory (DRAM).

2. Description of the Prior Art

When accessing a DRAM, each address is in two parts, the two parts commonly being referred to as the row address and the column address. This means that in effect two address strobe signals are required for each write or read operation, and this in turn means that a complex array of control signals are required.

DRAMs have been proposed for use in video field stores in digital television systems, for example, digital video tape recording and reproducing systems. However, the actual use of DRAMs in such systems has been inhibited by the problem of providing the required control signals with the necessary high degree of accuracy, stability and security in order to guarantee not to corrupt the memory contents.

SUMMARY OF THE INVENTION

One object of the present invention is to provide an improved means of deriving control signals for a DRAM.

Another object of the present invention is to provide a DRAM arrangement in which control signals are derived from a clock signal using delay devices.

Another object of the present invention is to provide a DRAM arrangement for storing digital television signal data under control of a system clock signal, input address signals associated with the data, and write enable, row address strobe and column address strobe signals derived from said clock signal using delay devices.

According to the present invention there is provided a dynamic random access memory arrangement for storing digital television signal data under control of a system clock signal and input address signals associated with said data, the arrangement comprising: a dynamic random access memory having a data input and a data output for said data, and an address input for said input address signals, said dynamic random access memory being controlled by a write enable signal, a row address strobe signal and a column address strobe signal; and means to derive said write address signal, said row address strobe signal and said column address strobe signal from said system clock signal with respective timings determined by a leading edge of a pulse of said system clock signal and delay devices.

The above, and other objects, features and advantages of this invention will be apparent from the following detailed description of illustrative embodiments which is to be read in connection with the accompanying drawings.

DESCRIPTION OF THE PREFERRED EMBODIMENTS

The DRAM arrangement to be described is for use in a video field store in a digital television system. With the now preferred standard sampling frequency of 13.5 MHz for the luminance signal and 6.75 MHz for the two chrominance signals of the television signal, a total active field can be contained within 512k bytes of memory. The DRAM arrangement to be described is a 256k byte store used for half a component field, or alternatively it can be used to store a complete composite sampled field.

With a data rate of 13.5 MHz (that is a period of 74 nanoseconds), and a total store size of 256k bytes, demultiplexing the data four ways brings the unit memory size to 64k bytes and the minimum cycle time slightly below 296 nanoseconds. This is well within the capability of many 64k DRAMs currently available, but the necessary control signals, in particular the write enable signal, the row address strobe signal and the column address strobe signal must each be provided with a very high degree of accuracy, stability and security. If this is not so, then the memory contents will be corrupted, and any such corruption is likely to involve an entire row in the memory, with consequent severe degradation of the picture represented by the television signal. Throughout the description which follows the write enable signal will be referred to as $\overline{WE}$, the row address strobe signal will be referred to as $\overline{RAS}$ and the column address strobe signal will be referred to $\overline{CAS}$.

Figure 1:
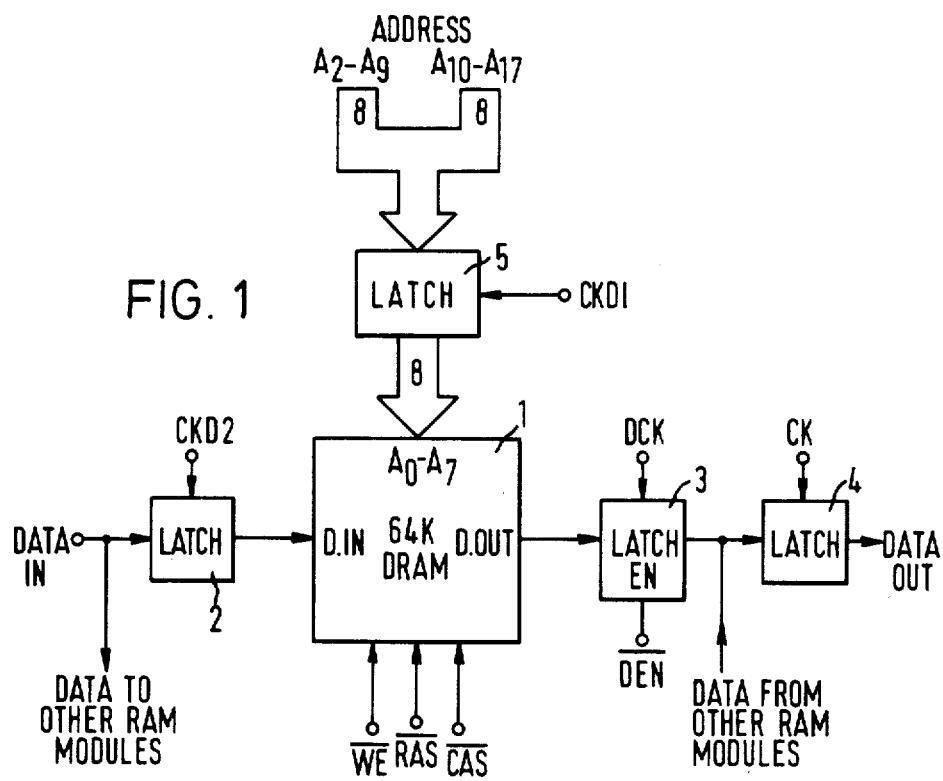
FIG. 1 shows in block form a DRAM together with circuits for feeding data into and out of the DRAM and for feeding addresses to the DRAM.

Referring to FIG. 1, the DRAM arrangement comprises four identical DRAM modules, one only of which is shown in the figure, the other three being connected in parallel at the data input and output points shown in the figure. Each of the DRAM modules provides 64k bytes of memory, so that with the four-way demultiplexing used, the DRAM arrangement as a whole provides the necessary 256k bytes of memory.

The DRAM module shown in FIG. 1 comprises a 64k DRAM 1 which may, for example, be the type HM 4864 supplied by Hitachi. The input data is supplied by way of a latch circuit 2 to the data input of the DRAM 1 and data from the data output of the DRAM 1 is supplied by way of two further series-connected latch circuits 3 and 4 to a data output of the DRAM arrangement. Each address for the DRAM arrangement comprises eighteen digits, referred to as A0 to A17. Of these digits, the two least significant digits A0 and A1, which will be referred to in more detail below, control the demultiplexing, and the remaining sixteen digits are split into two groups of eight, A2 to A9 and A10 to A17, to provide the required row and column addresses. The address signals are supplied to the address inputs of the DRAM 1 by way of a further latch circuit 5.

The latch circuit 2 is controlled by a clock signal CKD2, the latch circuit 3 is controlled by a clock signal DCK and an enable signal $\overline{DEN}$, the latch circuit 4 is controlled by a system clock signal CK, and the latch circuit 5 is controlled by a clock signal CKD1. Finally, the DRAM 1 is controlled by the signals $\overline{WE}$, $\overline{RAS}$ and $\overline{CAS}$ which are supplied to $\overline{WE}$, $\overline{RAS}$ and $\overline{CAS}$ input terminals as shown. The present description is particularly concerned with the manner of deriving the signals $\overline{WE}$, $\overline{RAS}$ and $\overline{CAS}$, and also the signals DCK and $\overline{DEN}$.

Figure 2:
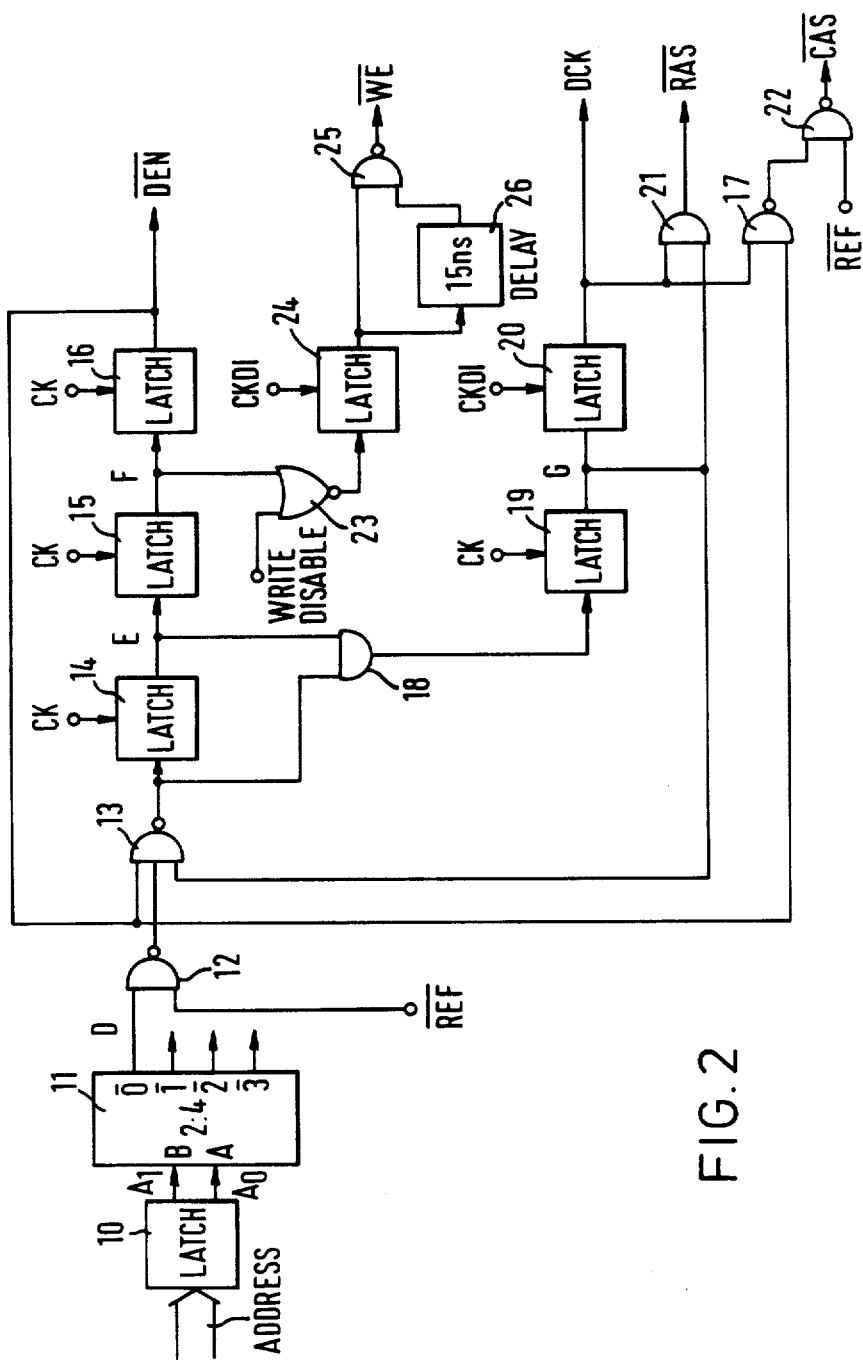
FIG. 2 shows in block form a circuit for generating control signals for supply to the DRAM of FIG. 1.

Referring now to FIG. 2, the signals $\overline{WE}$, $\overline{RAS}$ and $\overline{CAS}$, and also the enable signal $\overline{DEN}$ and the clock signal DCK, are derived by a circuit comprising an input latch circuit 10 to which the address digits A0 to A17 are supplied and which latches out the two address digits A0 and A1 and supplies them to A and B inputs of a 2:4 decoder 11 to control the required demultiplexing. The decoder 11 has four outputs and only the part of the circuit associated with the $\overline{0}$ output is shown. Further identical parts of the circuit are associated with the $\overline{1}$, $\overline{2}$ and $\overline{3}$ outputs of the decoder 11 and derive respective further signals $\overline{WE}$, $\overline{RAS}$ and $\overline{CAS}$ and also the signals DCK and $\overline{DEN}$ for the other three DRAMs 1 (FIG. 1) in the DRAM arrangement.

The $\overline{0}$ output of the decoder 11 is connected to one input of a two-input NAND gate 12, the output of which is connected to one input of a three-input NAND gate 13. To the other input of the NAND gate 12 is supplied a refresh signal $\overline{REF}$, which will be referred to in more detail below. The output of the NAND gate 13 is supplied to a series path comprising three latch circuits 14, 15 and 16, the output of the final latch circuit 16 providing the enable signal $\overline{DEN}$ which is supplied to an output and also fed back to a second input of the NAND gate 13 and to one input of a two-input NAND gate 17. The output of the NAND gate 13 is also supplied to one input of a two-input AND gate 18, to the other input of which is supplied the output of the latch circuit 14. The output of the AND gate 18 is connected to a series path comprising two further latch circuits 19 and 20. The output of the latch circuit 19 is fed back to the third input of the NAND gate 13 and is also supplied to one input of a two-input AND gate 21. The output of the latch circuit 20, which forms the clock signal DCK is supplied to an output and also to the other input of the AND gate 21. The output of the AND gate 21 forms the signal $\overline{RAS}$. The output of the latch circuit 20 is also supplied to the other input of the NAND gate 17, the output of which is connected to one input of a two-input NAND gate 22. To the other input of the NAND gate 22 is supplied the refresh signal $\overline{REF}$, and the output of the NAND gate 22 forms the signal $\overline{CAS}$. The output of the latch circuit 15 is supplied to one input of a two-input NOR gate 23, to the other input of which is supplied a write disable signal. The output of the NOR gate 23 is supplied by way of a latch circuit 24 to one input of a two-input NAND gate 25. The output of the latch circuit 24 is also supplied by way of a calibrated analog delay line 26 comprising a lumped LC circuit, which provides a delay of 15 nanoseconds, to the other input of the NAND gate 25. The output of the NAND gate 25 forms the signal $\overline{WE}$.

The latch circuits 10, 14, 15, 16 and 19 are controlled by the system clock signal CK, while the latch circuits 20 and 24 are controlled by the clock signal CKD1.

Figure 3:
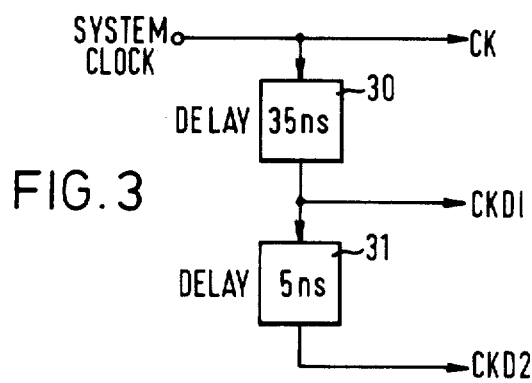
FIG. 3 shows in block form a circuit for deriving clock signals for supply to the circuit of FIG. 2.

Referring now to FIG. 3, this shows the derivation of the clock signals CKD1 and CKD2. To an input of the circuit is supplied the system clock signal CK, that is to say the basic system clock signal derived in dependence on the input data. The system clock signal CK is supplied directly to an output and also to the input of a calibrated analog delay line 30 comprising a lumped LC circuit which provides a delay of 35 nanoseconds. The output of the delay 30, which forms the clock signal CKD1, is supplied to an output and also to the input of a further calibrated analog delay line 31 comprising a lumped LC circuit which provides a delay of 5 nanoseconds. The output of the delay 31 forms the clock signal CKD2.

Figure 4:
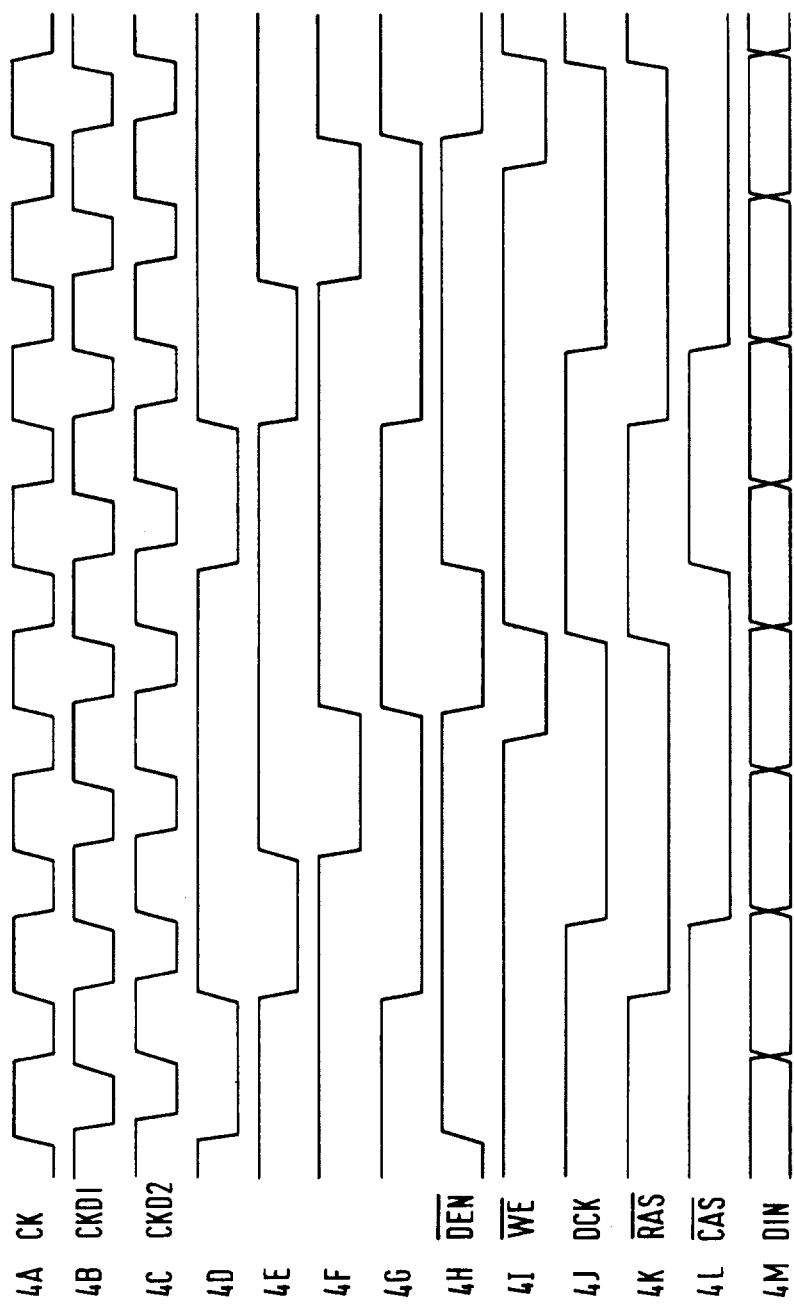
FIGS. 4A through 4M are waveform diagrams showing waveforms at various points in the circuit of FIG. 2.

The operation of the DRAM arrangement will now be described with reference also to FIG. 4 which shows the waveforms appearing at various points in the arrangment. Basically the timing is controlled by the system clock signal CK as shown in FIG. 4A, the period of which is of course equal to the bit period of the data DIN shown in FIG. 4M.

As indicated in FIG. 3, the clock signals CKD1 and CKD2 of FIGS. 4B and 4C are derived by delaying the system clock signal CK by 35 and 40 nanoseconds respectively. It is to be noted that this and all the other timings involved in producing the signals $\overline{WE}$, $\overline{RAS}$ and $\overline{CAS}$ are determined in dependence on just one positive-going leading edge of a pulse of the system clock signal CK, so that the accuracy of the timing is not affected by any inaccuracies in the pulse lengths of the system clock signal CK.

FIGS. 4D, 4E, 4F and 4G show the waveforms at the points D, E, F and G in the circuit of FIG. 2, that is at the 0 output of the decoder 11 and the outputs of the latch circuits 14, 15 and 19 respectively.

FIGS. 4H, 4I, 4J, 4K and 4L show the output signals of the circuit of FIG. 2, that is to say the enable signal $\overline{DEN}$, the signal $\overline{WE}$, the clock signal DCK, the signal $\overline{RAS}$ and the signal $\overline{CAS}$ respectively.

It will be appreciated that once operation of the circuit of FIG. 2 is initiated by a positive-going leading edge of a pulse of the system clock signal CK, the operation will continue unit the full sequence has been completed, and any attempt to initiate the operation again during this time will be ignored. Each such initiation must be at least four cycles of the system clock signal CK apart.

It is a feature of the DRAM 1 which is used that it requires refreshing of the rows at intervals because the storage elements are simple capacitive elements. Such refreshing is required at maximum intervals of about two milliseconds, and each time such refreshing is to take place all four of the DRAMs 1 are refreshed simultaneously, so each of the four circuits as shown in FIG. 2 is simultaneously enabled by supplying the refresh signal $\overline{REF}$ to the NAND gates 12 and 17. Supply of the refresh signal $\overline{REF}$ to the NAND gate 12 initiates the operation, while supply of the refresh signal $\overline{REF}$ to the NAND gate 22 disables generation of the signal $\overline{CAS}$ which is not required in the refresh operation.

Supply of a write disable signal to the NOR gate 23 will prevent the signal $\overline{WE}$ being produced when not required, such as during the refresh and the read operations.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A dynamic random access memory arrangement for storing digital television signal data under control of a single system clock signal from a system clock generator and input address signals corresponding to said data, the arrangement comprising: delay means receiving said single system clock signal for producing therefrom a plurality of latch clock signals having predetermined time delays; means for deriving a write enable signal, a row address strobe signal, and a column address strobe signal from said single system clock signal, wherein timing of each respective write enable signal, row address strobe signal, and column address strobe signal is determined by a leading edge of successive pulses of said single system clock signal; and dynamic random access memory means having a data input and a data output for said data, and an address input for said input address signals; and latch means connected to said address input, said data input, and said data output, of said dynamic random access memory means for controlling address and data flow therein in response to said plurality of latch clock signals, and said dynamic random access memory is controlled by said write enable signal, said row address strobe signals and said column address strobe signal, whereby said digital television signal data fed into said data input through said latch means is stored in said dynamic random access memory at addresses determined by said input address signals in response to said write enable signal, said row address strobe signal and said column address strobe signal.

2. An arrangement according to claim 1 wherein said delay means comprise a plurality of calibrated, series connected delay lines each producing a respective one of said latch clock signals from said single system clock signal and each latch clock signal having a respective predetermined time delay for feeding to said means for deriving.

3. An arrangement according to claim 1 wherein said means for deriving said write enable signal, said row address strobe signal, and said column address strobe signal is a circuit comprising a plurality of logic gates and a calibrated delay line.

4. An arrangement according to claim 2, wherein said delay means comprises first and second delay devices, said first delay device being connected to receive said system clock signal for producing a first delayed signal by delaying said system clock signal by a first predetermined amount, and said second delay device being connected to receive said first delayed signal for producing a second delayed signal by delaying said first delayed signal by a second predetermined amount, substantially less than said first predetermined amount.

* * * * *